US012564113B2

(12) United States Patent
Ewald et al.

(10) Patent No.: US 12,564,113 B2
(45) Date of Patent: Feb. 24, 2026

(54) POWER ELECTRONICS MODULE

(71) Applicant: ZF Friedrichshafen AG, Friedrichshafen (DE)

(72) Inventors: Ake Ewald, Bayreuth (DE); Stefan Hain, Speichersdorf (DE); Fabian Hohmann, Hofbieber (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 387 days.

(21) Appl. No.: 18/363,471

(22) Filed: Aug. 1, 2023

(65) Prior Publication Data

US 2024/0047320 A1 Feb. 8, 2024

(30) Foreign Application Priority Data

| Aug. 1, 2022 | (DE) | 102022207922.1 |
| Aug. 1, 2022 | (DE) | 102022207925.6 |
| Aug. 26, 2022 | (DE) | 102022208839.5 |

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/56* (2013.01);
(Continued)

(58) Field of Classification Search
CPC ......... H01L 23/49811; H01L 23/49555; H01L 23/3107; H01L 23/49551; H01L 23/49562;
(Continued)

(56) References Cited

U.S. PATENT DOCUMENTS

| 7,095,099 | B2 * | 8/2006 | Oliver | H01L 24/06 |
| | | | | 257/676 |
| 2011/0227207 | A1 * | 9/2011 | Yilmaz | H01L 23/49524 |
| | | | | 257/676 |

(Continued)

FOREIGN PATENT DOCUMENTS

| JP | 2010-177574 A | 8/2010 |
| JP | 2015-133462 A | 7/2015 |

OTHER PUBLICATIONS

Office Action dated Apr. 20, 2023 for German Patent Application No. 10 2022 208 839.5 (30 pp.), note: pp. 1 and 2 are English language Explanations to Section C. Result of Determination Document.

*Primary Examiner* — Mohsen Ahmadi
(74) *Attorney, Agent, or Firm* — Crowell & Moring LLP

(57) ABSTRACT

A power electronics module, having a DBC PCB having power semiconductors arranged thereon, and a multilayered leadframe including at least two separate subframes. No power or control routing takes place on the PCB. A region of the load source subregion is arranged between the PCB and the gate source and kelvin source subregion and is in electrical contact with the power semiconductors, and an adjoining region is located outside the PCB. A region of the drain source subregion is in electrical contact with a drain terminal on the PCB, and an adjoining region is located outside the PCB. The gate source subregion and the kelvin source subregion have a region above the load source subregion at which said subregions are in electrical contact with the power semiconductors and have an adjoining region outside the PCB which is opposite the drain source subregion and has pins bent above the PCB.

12 Claims, 2 Drawing Sheets

(51) Int. Cl.

| | |
|---|---|
| *H01L 21/56* | (2006.01) |
| *H01L 23/00* | (2006.01) |
| *H01L 23/31* | (2006.01) |
| *H01L 23/373* | (2006.01) |
| *H01L 23/495* | (2006.01) |
| *H01L 25/07* | (2006.01) |

(52) U.S. Cl.

CPC ........ *H01L 23/49555* (2013.01); *H01L 24/48* (2013.01); *H01L 25/072* (2013.01); *H01L 2224/48091* (2013.01); *H01L 2224/48245* (2013.01)

(58) Field of Classification Search

CPC ........... H01L 23/49575; H01L 23/3735; H01L 23/49531; H01L 24/48; H01L 25/072; H01L 21/4842

See application file for complete search history.

(56) References Cited

U.S. PATENT DOCUMENTS

| | | | |
|---|---|---|---|
| 2012/0223321 A1* | 9/2012 | Lin ........................ | H01L 25/074 |
| | | | 257/E29.068 |
| 2013/0175704 A1* | 7/2013 | Jeun .................... | H01L 23/3735 |
| | | | 257/E23.116 |
| 2014/0264799 A1* | 9/2014 | Gowda ............... | H01L 23/3677 |
| | | | 438/122 |
| 2015/0162287 A1* | 6/2015 | Hosseini ............ | H10D 62/8503 |
| | | | 257/629 |
| 2019/0157190 A1* | 5/2019 | Fuergut ............. | H01L 23/49548 |
| 2019/0287943 A1* | 9/2019 | Wang ..................... | H01L 24/41 |
| 2020/0258824 A1* | 8/2020 | Maldo ................ | H01L 23/3735 |
| 2022/0093486 A1* | 3/2022 | Reiter .............. | H01L 23/49811 |
| 2024/0332141 A1* | 10/2024 | Kim ....................... | H01L 24/85 |
| 2024/0356322 A1* | 10/2024 | Deshpande ........ | H05K 7/14329 |

* cited by examiner

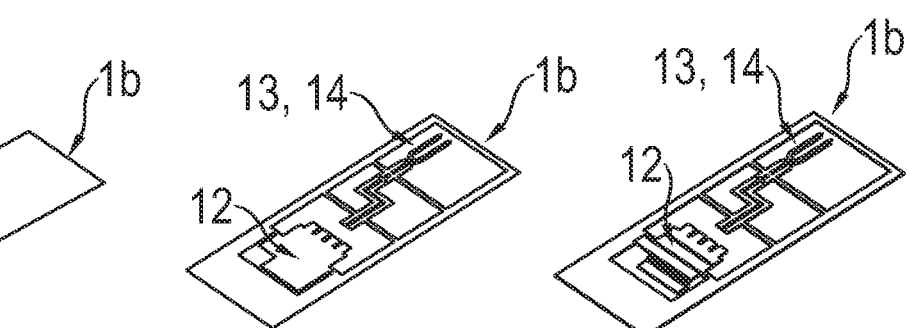
Fig. 4
Fig. 5
Fig. 6
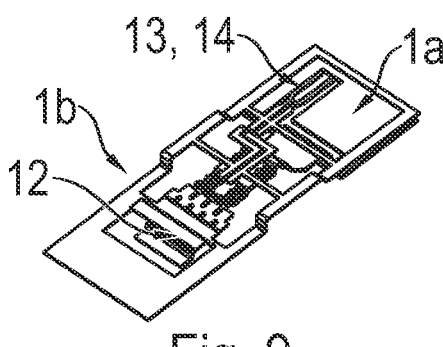
Fig. 7
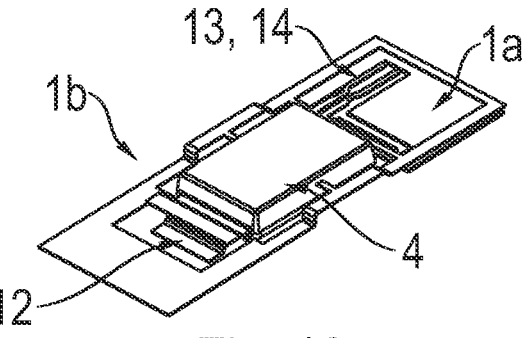
Fig. 8
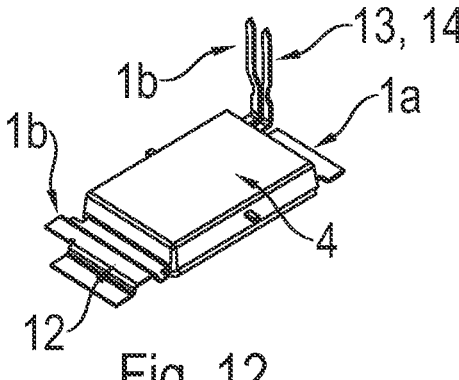
Fig. 9
Fig. 10
Fig. 12
Fig. 11

POWER ELECTRONICS MODULE

CROSS-REFERENCE TO RELATED APPLICATIONS

This application claims priority to German Application Nos. DE 10 2022 207 922.1, filed on Aug. 1, 2022, DE 10 2022 207 925.6, filed on Aug. 1, 2022 and DE 10 2022 208 839.5, filed on Aug. 26, 2022, the entireties of which are each hereby fully incorporated by reference herein.

FIELD

The present invention relates to the field of electromobility, in particular of electronics modules.

The use of electronics modules, for example power electronics modules, in motor vehicles has increased significantly in recent decades. This can be attributed firstly to the need to improve the fuel saving and the vehicle performance and secondly to the advances in semiconductor technology.

In order to be able to provide the energy, a multiplicity of electronics component parts is required with which, for example, bridge circuits (for example half-bridges) are realized, for example semiconductor power switches, which are also referred to as power semiconductors. Power semiconductors can be installed in complete power electronics modules (also referred to as power modules) or as discrete component parts.

Power electronics modules have a printed circuit board having power semiconductors arranged thereon which have been brought into electrical contact with one another on the printed circuit board for power and control routing. So-called leadframes are also already available, i.e. metallic line carriers for producing electrical connections to the inside and to the outside. However, despite the known leadframes, there is still a problem of providing as high a power density as possible in the power electronics module.

Therefore, the invention is based on the object of providing a power electronics module by means of which a higher power density can be achieved.

This object is achieved by the features of the independent claims. Advantageous configurations are the subject matter of the dependent claims.

What is proposed is a power electronics module, having a DBC printed circuit board having power semiconductors arranged on an uppermost layer of said DBC printed circuit board and a multilayered leadframe for three-dimensional power and control routing, wherein the multilayered leadframe consists of at least two separate subframes. Subregions of the multilayered leadframe are designed to act as electrical contact-connection of drain source and/or load source and/or gate source and/or kelvin source in such a way that no power and control routing takes place on the DBC printed circuit board. A region of the subregion acting as load source is arranged between the DBC printed circuit board and the subregion acting as gate source and kelvin source and has been brought into electrical contact with the power semiconductors, and an adjoining region is located outside the DBC printed circuit board. A region of the subregion acting as drain source has been brought into electrical contact with a drain terminal arranged on the uppermost layer of the DBC printed circuit board, and an adjoining region is located outside the DBC printed circuit board. The subregion acting as gate source and the subregion acting as kelvin source have a region above the subregion acting as load source at which said subregions have been brought into electrical contact with the power semiconductors and have an adjoining region outside the DBC printed circuit board which is opposite the subregion acting as drain source and has pins which are bent to above the DBC printed circuit board.

In one embodiment, the subregion acting as gate source and the subregion acting as kelvin source have been brought into electrical contact with the power semiconductors by means of wire bonds, wherein the subregions in the form of load source and drain source have been brought into electrical contact with the power semiconductors or the drain terminal by means of soldering or sintering.

In one embodiment, the subregion acting as load source has a plurality of curvatures in the region at which said subregion has been brought into contact with the power semiconductors in such a way that free regions are formed between it and the power semiconductors and the DBC printed circuit board and the subregion acting as drain source.

In one embodiment, the DBC printed circuit board, the power semiconductors and those subregions of the multilayered leadframe which are arranged in the region of the DBC printed circuit board are surrounded by a casting or mold compound.

In one embodiment, the subregion acting as load source is in the form of a separate first subframe, and the subregions acting as drain source, as gate source and as kelvin source are part of a second subframe.

In one embodiment, in the case where the subregion acting as load source and the subregion acting as drain source are formed from two separate subframes, an end region of the subregion acting as load source runs at a distance above the subregion acting as drain source.

In one embodiment, the end region of the subregion acting as load source ends in front of an end region of the subregion acting as drain source or overlaps therewith.

In addition, a method for producing a multilayered leadframe for use in the power electronics module is provided, wherein, in advance, at least two subframes are produced separately from one another from an electrically conductive metal sheet, and wherein drain source and/or load source and/or gate source and/or kelvin source are formed as part of one of the subframes, wherein each of the subframes is formed in such a way that parts thereof lie in a region within the DBC printed circuit board, and other regions, which are used as external electrical contact-connection, lie outside of the DBC printed circuit board, and wherein at least one of the subframes is formed in such a way that at least one of the structures of drain source and/or load source and/or gate source and/or kelvin source is formed therefrom, wherein, in addition, an outer frame surrounding the DBC printed circuit board and cross-connections are provided in the frame structure.

In addition, a fitting method for the power electronics module is provided, wherein the subframes of the multilayered leadframe are applied to the DBC printed circuit board populated with power semiconductors and are brought into contact with the power semiconductors, and then a casting or mold compound is fitted on the DBC printed circuit board, and then the outer frame located outside the casting or mold compound and the cross-connections are separated off, with the result that now only the external electrical contacts of the drain source, the load source, the gate source and the kelvin source protrude out of the casting or mold compound.

In addition, an inverter is provided, having the power electronics module. In addition, an electric drive of a vehicle is provided, having the inverter. Likewise, a motor vehicle is provided, having an electric motor driven by means of an electric drive.

Further features and advantages of the invention can be gleaned from the description below of exemplary embodiments of the invention, with reference to the figures in the drawings which show details according to the invention, and from the claims. The individual features can be implemented in each case individually or together in any desired combination in one variant of the invention.

Preferred embodiments of the invention will be explained in more detail below with reference to the appended drawings.

BRIEF DESCRIPTION OF THE DRAWINGS

FIGS. 4, 5, 6, 7, and 8 show a sequence of the method for producing a subframe of the multilayered leadframe in accordance with one embodiment of the present invention.

FIGS. 9, 10, 11, and 12 show a sequence of the method for producing a power electronics module in accordance with one embodiment of the present invention.

DETAILED DESCRIPTION

Figures 1, 2, 3:
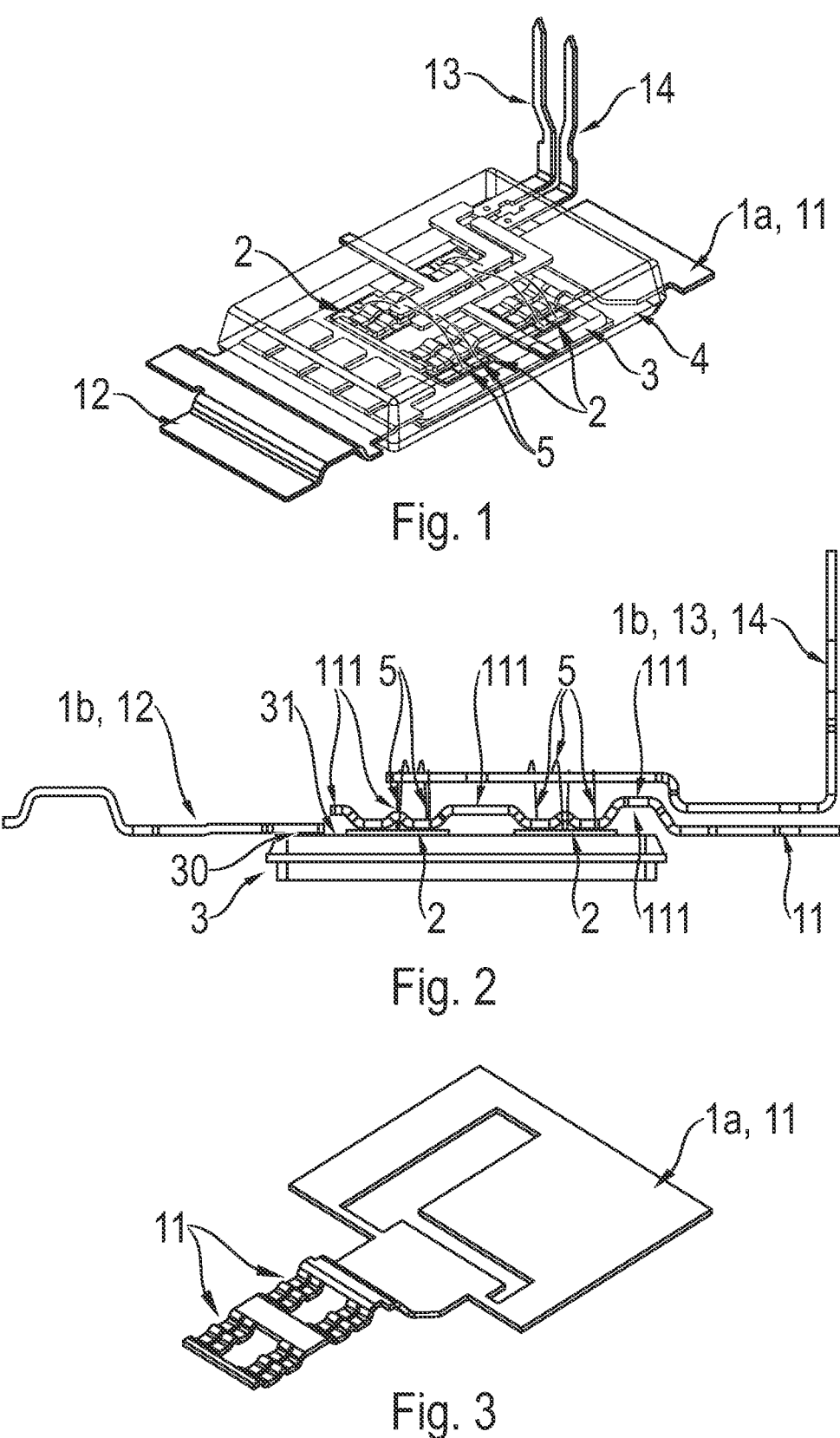
FIG. 1 shows a basic design of a power electronics module in accordance with one embodiment of the present invention.
FIG. 2 shows a sectional illustration of the power electronics module shown in FIG. 1.
FIG. 3 shows a sectional illustration of a subframe of the multilayered leadframe in accordance with one embodiment of the present invention.

In the following descriptions of the figures, identical elements or functions are provided with the same reference signs.

In current power electronics modules, often parts of the printed circuit board are separated off from the power semiconductors 2 for the conduction of signals, with the result that they no longer have any advantageous thermal influence, and this therefore results in a reduction in the power density of the component part (of the power semiconductor 2).

In order to achieve an improved power density in the case of power electronics modules, in accordance with the invention the power and control routings previously routed on the printed circuit board are now only routed on a leadframe 1. For this purpose, the leadframe 1 is in the form of a multilayered leadframe 1. The printed circuit board 3 is in the form of a DBC (direct bonded copper) printed circuit board 3, also referred to below as DBC 3, for short. Power semiconductors 2 are arranged on the DBC printed circuit board 3, and electrical contact is made with said power semiconductors 2 via corresponding connections (bonds, soldered joints, etc.) for power and control routing.

The concept according to the invention is characterized by the fact that a multilayered leadframe 1 is used. This enables three-dimensional power and signal routing within the package (power electronics module encapsulated by molding) without the use of the DBC 3 for the signal contact-connection and without requiring a compromise in terms of the arrangement/connection of the power semiconductors 2.

The multilayered leadframe 1 in this case consists of at least two separate subframes 1a and 1b. Subregions 11-14 of the multilayered leadframe 1 are designed to act as electrical contact-connection of drain source 12 and/or load source 11 and/or gate source 13 and/or kelvin source 14 in such a way that power and control routing no longer takes place on the DBC printed circuit board 3. In this case, each of the subregions 11-14 is part of one of the subframes 1a, 1b.

In the embodiment shown in the figures, the subregion 11, which acts as load source terminal 11, referred to below as load source 11 for short, is in the form of a separate subframe 1a. The other subregions, i.e. the terminals acting as drain source 12, gate source 13 and kelvin source 14, are in the form of a second subframe 1b, which is produced separately from the first subframe 1a. However, for example, drain source 12 and load source 11 can also be provided as a subframe 1a and gate source 13 and kelvin source 13 as another, separate subframe 1b. In principle, any combination is conceivable as long as the power and signal routing and the electrical insulation between the components is ensured.

The invention will be described below with reference to an embodiment in which load source 11 is in the form of a separate subframe 1a and the other terminals, i.e. drain source 12, gate source 13 and kelvin source 14, are formed by a second subframe 1b which is separate from the first subframe 1a.

As shown in FIGS. 1 and 2, a plurality of power semiconductors 2 is arranged on the uppermost layer 31 of the DBC 3. Electrical contact has been made with said semiconductors 2 by means of the subframe 1a, which acts as load source 11, for example by means of sintering or soldering. The subframe 1a which forms the load source 11 is formed in such a way that it can provide the contact-connection of the power semiconductors 2. Advantageously, as is shown in FIGS. 1 and 2 and is illustrated more precisely in FIG. 3, additional curvatures 111 are provided in the subframe 1a, in particular between contact points of adjacent power semiconductors 2. As a result, a hollow interspace can be formed into which a casting or mold compound 4 can be introduced during fitting which is used for electrical insulation and for mechanical stabilization of the components.

Likewise, a drain terminal 30 of the DBC 3 for load-feeding is provided on the uppermost layer 31 of the DBC 3 and directly adjacent to power semiconductors 2 arranged thereon. Electrical contact has been made with a region of the drain source 12 at this drain terminal 30, for example by means of soldering, sintering or welding. Further regions of the drain source 12 protrude outwards to outside the DBC 3 in order to enable the external contact-connection.

Furthermore, it is advantageous if load source 12 also has a curvature 111 to above the drain source 12 in the region at which load source 11 and drain source 12 come close to each other in order to maintain the required (electrical) distance from the drain source 12. By virtue of the isolation of load source 11 and drain source 12 on two separate subframes 1a, 1b, a very short distance is possible between the power semiconductors 2 and the drain terminal 30 on the DBC 3 since not both terminals need to be formed from a common plane and no lines are routed on the DBC 3. That is to say that the two subframes 1a, 1b can also be arranged closer to one another.

In addition, subregions of the subframe 1b which provide gate source 13 and kelvin source 14 are located at a distance above the load source 11, i.e. the subframe 1a. A region of the subframe 1b is located directly above the load source 11 and at a distance therefrom in order to be brought into electrical contact with the power semiconductors 2, for example by means of wire bonds. An adjoining region protrudes outwards to outside the DBC 3 in order to enable the external contact-connection. For this purpose, end regions in the form of pins are correspondingly bent in such a way that they point to above the DBC 3.

Gate source 13, kelvin source 14 and that part of the load source 11 which protrudes out of the DBC 3 advantageously lie on another side (but above the uppermost layer 31) of the DBC 3 as the drain source 12 (in the figure drain source 12 is on the left, and gate source 13, kelvin source 14 and load source 11 are on the right).

In all embodiments, advantageously an electrically insulating compound, which can also act as heat dissipation, is provided in the region between the DBC 3 and the subframes 1a, 1b. Such a casting or mold compound 4 can be a resin or another compound which is introduced into the power electronics module and cured during the production process. The casting or mold compound 4 in this case flows into all free regions, i.e. also into the intermediate regions between the subframes 1a, 1b and the power semiconductors 2, and the DBC 3. This casting or mold compound 4 also acts as mechanical stabilization of the individual components during fitting.

Owing to the fact that the signal lines, which are generally routed on the DBC 3, are dispensed with (they are taken over by the subframes 1a and 1b), an optimum distribution of the power semiconductors 2 on the complete area of the DBC 3 is enabled. Therefore, an optimal thermal link can be achieved in the case of a maximum possible semiconductor area in the module.

The connection process (for example sintering) of the power semiconductors 2 in the same way as the contact-connection of the drain terminal 30 and the wire bonds 5 for connecting the gate source 13 or kelvin source 14 can take place after the positioning of the two subframes 1a, 1b, with the result that no additional step in the manufacture is necessary.

As can be seen easily in the figures, the subregions 12-14 are electrically isolated from one another in the fitted state, i.e. the subframe 1b disintegrates into a plurality of individual parts after fitting. Prior to fitting, the subregions 12-14 are connected to one another by the frame structure, as is shown in FIGS. 4-8 and described afterwards with reference to the production method.

The two subframes 1a, 1b are manufactured, as usual, from a sheet-metal part, wherein the desired forms are produced by corresponding methods such as stamping and bending.

The subframe 1a shown in FIG. 3 is formed in the described embodiment in such a way that the contact-connection of the power semiconductors 2 on the DBC 3 and the provision of an electrical contact to the outside of the DBC 3 is possible. In this case, it can be bent a plurality of times so that the curvatures 111 already described are produced in order to provide corresponding intermediate regions with respect to the power semiconductors 2, the DBC 3 and the other subframe 1b. In this way, the gate source 13 and the kelvin source 14 can still be stabilized in the region of the power semiconductors 2 for the connection process and the subsequent encapsulation by molding. The region on the right in FIG. 3 can in this case be formed in such a way that it can accommodate the subregions 13 and 14 during fitting, i.e. the pins of gate source 13 and kelvin source 14. Therefore, a planar area is produced from the two subframes 1a, 1b, which simplifies the production process of the power electronics module.

FIGS. 4 to 8 show the production of the subframe 1b. In this case, the sheet metal (unmachined in FIG. 4) is machined, for example punched out, in such a way that the subregions drain source 12, gate source 13 and kelvin source 14 are formed (see FIG. 5). In this case, an outer frame and cross-connections are left standing in the frame structure which act as stabilization and temporary connection between the subregions 12-14 up to the end of the fitting. In this case it is important that neither the outer frame nor the cross-connections are arranged in such a way that electrical connections between the subregions 12-14 are provided within the subsequently applied casting or mold compound 4 since they can no longer be removed. Therefore, all of the connections which are not required or desired later are provided outside the region which the casting or mold compound 4 will occupy. The outer frame in this case surrounds the DBC 3, and its circumference is therefore greater than the DBC 3.

In further steps, the drain source 12 (indicated in FIG. 6 by the circle) and required curvatures of the gate source 13 and kelvin source 14 (indicated in FIG. 7 by the circle) and the pins of the gate source 13 and kelvin source 14 (indicated in FIG. 8 by the circle) are formed, preferably by a bending method. In this case, the order as to which regions are formed first is dependent on the forms and the machine used. Therefore, the order does not necessarily need to be the order shown in FIGS. 6-8. Advantageously, it is even such that the pins of the gate source 13 and kelvin source 14 (FIG. 8) are only bent upwards at the end of the fitting method since, as a result, other processes are simplified and the risk of the pins breaking off is reduced.

The fitting method is illustrated in very abstract form in FIGS. 9 to 12. FIG. 9 shows that the two subframes 1a, 1b are fitted on the DBC 3 (not shown). Then, the electrical connections are produced (not illustrated). Then, the DBC 3 with the power semiconductors 2 and the multilayered leadframe 1 is surrounded or encapsulated by molding by an electrically insulated casting or mold compound 4 (FIG. 10). After this process step, the regions of the subframes 1a, 1b which are used for electrical contact-connection of the DBC 3 from the outside are located outside the mold compound 4. In addition, the outer frame and parts of the cross-connections are still visible from the outside. Advantageously, in the next step, the pins of the gate source 13 and kelvin source 14 are only now bent upwards. In a final step, the unrequired outer frame is removed.

By virtue of the removal of the outer frame, the subregions 12-14 of the subframe 1b are now also electrically isolated from one another since there is no longer a connection. Therefore, three separate subregions of the subframe 1b have been formed.

The term power semiconductor 2 includes both individual topological switches and half-bridges/B6 bridges. The multilayered leadframe 1 is formed from an electrically conductive metal sheet which is suitable for stamping and bending.

A power electronics module within the scope of this invention is used for operating an electric motor of a motor vehicle driven by means of a rechargeable battery fuel cell. The motor vehicle is in particular a utility vehicle, such as an HGV or a bus, or a passenger car. The power electronics module comprises an inverter. It may also be a rectifier, a DC/DC converter, a transformer and/or another electrical converter or part of such a converter or some of them. In particular, the power electronics module is used for supplying current to an electric machine, for example an electric motor and/or a generator. An inverter is preferably used for generating a polyphase alternating current from a direct current generated by means of a DC voltage of an energy source, for example a battery. A DC/DC converter is used, for example, to convert (step up) a direct current coming from a fuel cell into a direct current which can be used by the drive.

DC/DC converters and inverters for electric drives of vehicles, in particular passenger cars and utility vehicles, as well as buses, are designed for the high-voltage range and are designed in particular in a blocking voltage class of above approximately 650 volts.

The described inverter arrangement is used, for example, in motor vehicles. The motor vehicle can in particular have an electrically driven axle. The motor vehicle can in principle be in the form of a purely internal combustion engine-based motor vehicle, of a hybrid motor vehicle or of an electric vehicle.

LIST OF REFERENCE SIGNS 1 multilayered leadframe
1a, 1b subframe
11 load source
111 curvatures
12 drain source
13 gate source
14 kelvin source
2 power semiconductor
3 DCB printed circuit board
30 drain terminal
31 uppermost layer of 3
4 casting or mold compound
5 wire bonds

The invention claimed is:

1. A power electronics module, comprising:
a direct bonded copper (DBC) printed circuit board comprising power semiconductors arranged on an uppermost layer of said DBC printed circuit board; and
a multilayered leadframe configured for three-dimensional power and control routing,
wherein the multilayered leadframe comprises at least two separate subframes,
and wherein subregions of the multilayered leadframe are configured to act as electrical contact-connection of drain source and/or load source and/or gate source and/or kelvin source such that no power routing and no control routing takes place on the DBC printed circuit board,
wherein a region of the subregion acting as load source is arranged between the DBC printed circuit board and a subregion acting as gate source and kelvin source, and is in electrical contact with the power semiconductors, and wherein an adjoining region is located outside the DBC printed circuit board, and
wherein a region of the subregion acting as drain source is in electrical contact with a drain terminal arranged on the uppermost layer of the DBC printed circuit board, and wherein an adjoining region is located outside the DBC printed circuit board, and
wherein the subregion acting as gate source and the subregion acting as kelvin source have a region above the subregion acting as load source at which said subregions have are in electrical contact with the power semiconductors and have an adjoining region outside the DBC printed circuit board which is opposite the subregion acting as drain source and has pins which are bent to above the DBC printed circuit board.

2. The power electronics module according to claim 1, wherein the subregion acting as gate source and the subregion acting as kelvin source are in electrical contact with the power semiconductors by wire bonds, and wherein the subregions in the form of load source and drain source are in electrical contact with the power semiconductors or the drain terminal by soldering or sintering.

3. The power electronics module according to claim 1, wherein the subregion acting as load source has a plurality of curvatures in a region at which the subregion acting as load source is in contact with the power semiconductors such that free regions are formed between it and the power semiconductors and the DBC printed circuit board and the subregion acting as drain source.

4. The power electronics module according to claim 1, wherein the DBC printed circuit board, the power semiconductors, and subregions of the multilayered leadframe which are arranged in the region of the DBC printed circuit board are surrounded by a casting or mold compound.

5. The power electronics module according to claim 1, wherein the subregion acting as load source is in the form of a separate first subframe, and the subregions acting as drain source, as gate source and as kelvin source are part of a second subframe.

6. The power electronics module according to claim 1, wherein the subregion acting as load source and the subregion acting as drain source are formed from two separate subframes, and an end region of the subregion acting as load source runs at a distance above the subregion acting as drain source.

7. The power electronics module according to claim 6, wherein the end region of the subregion acting as load source ends in front of an end region of the subregion acting as drain source.

8. The power electronics module according to claim 6, wherein the end region of the subregion acting as load source overlaps with an end region of the subregion acting as drain source.

9. An inverter, comprising the power electronics module according to claim 1.

10. An electric drive of a vehicle, comprising the inverter according to claim 9.

11. A motor vehicle, comprising an electric motor driven by the electric drive according to claim 10.

12. A method for producing a power electronics module, comprising:
providing a direct bonded copper (DBC) printed circuit board comprising power semiconductors arranged on an uppermost layer of said DBC printed circuit board; and
producing a multilayered leadframe configured for three-dimensional power and control routing,
wherein the multilayered leadframe is formed in such a way that:
subregions of the multilayered leadframe are configured to act as electrical contact-connection of drain source and/or load source and/or gate source and/or kelvin source such that no power routing and no control routing takes place on the DBC printed circuit board,
a region of the subregion acting as load source is arranged between the DBC printed circuit board and a subregion acting as gate source and kelvin source, and is in electrical contact with the power semiconductors, and wherein an adjoining region is located outside the DBC printed circuit board, and
wherein a region of the subregion acting as drain source is in electrical contact with a drain terminal arranged on the uppermost layer of the DBC printed circuit board, and wherein an adjoining region is located outside the DBC printed circuit board, and wherein the subregion acting as gate source and the subregion acting as kelvin source have a region above the subregion acting as load source at which said subregions have are in electrical contact with the power semiconductors and have an adjoining region outside the DBC printed circuit board which is opposite the subregion acting as drain source and has pins which are bent to above the DBC printed circuit board.

* * * * *